United States Patent [19]
Jessen

[11] Patent Number: 5,905,394
[45] Date of Patent: May 18, 1999

[54] LATCH CIRCUIT

[75] Inventor: Jeppe Rune Jessen, Veksø, Denmark

[73] Assignee: Telefonaktiebolaget LM Ericsson, Stockholm, Sweden

[21] Appl. No.: 09/013,747

[22] Filed: Jan. 27, 1998

[30] Foreign Application Priority Data

Jan. 27, 1997 [SE] Sweden .................................. 9700222

[51] Int. Cl.$^6$ .......................... H03K 5/153; H03K 3/356
[52] U.S. Cl. ........................................... 327/208; 327/212
[58] Field of Search .................................... 327/199, 200, 327/201, 208–215, 218, 219

[56] References Cited

U.S. PATENT DOCUMENTS

| | | | |
|---|---|---|---|
| 4,488,063 | 12/1984 | Lee | 327/199 |
| 4,628,216 | 12/1986 | Mazumder | 326/126 |
| 4,725,793 | 2/1988 | Igarashi | 333/26 |
| 4,754,173 | 6/1988 | Smith et al. | 326/126 |
| 4,810,900 | 3/1989 | Okabe | 327/187 |
| 4,866,306 | 9/1989 | Hopta | 290/48 |
| 4,870,375 | 9/1989 | Krueger, Jr. et al. | 333/33 |
| 4,885,556 | 12/1989 | Lamberty et al. | 333/21 A |
| 5,049,760 | 9/1991 | Ooms | 327/212 |
| 5,065,123 | 11/1991 | Heckaman et al. | 333/246 |
| 5,134,312 | 7/1992 | Jones, Jr. et al. | 327/223 |
| 5,144,158 | 9/1992 | Kanal et al. | 327/199 |
| 5,164,358 | 11/1992 | Buck et al. | 505/210 |
| 5,225,796 | 7/1993 | Williams et al. | 333/12 |
| 5,311,159 | 5/1994 | Miura et al. | 333/204 |
| 5,808,488 | 9/1998 | Bruccoleri et al. | 327/211 |

FOREIGN PATENT DOCUMENTS

| | | |
|---|---|---|
| 0326883 | 8/1989 | European Pat. Off. . |
| 0361527 | 4/1990 | European Pat. Off. . |
| 0 497 181 | 1/1992 | European Pat. Off. . |
| 59-10573 | 6/1984 | Japan . |
| 62-258515 | 11/1987 | Japan . |
| 5-14138 | 1/1993 | Japan . |

OTHER PUBLICATIONS

Chiba, Taneaki, et al., "Suppression of Higher Modes and Cross Polarized Component for Microstrip Antenna," IEEE AP Symp., pp. 285–288 (1982).

Herscovici, Naftali I., et al., "A Microstrip Array Fed by a New Type of Multilayer Feeding Network," Microwave Journal, pp. 124–134 (Jul., 1995).

Herscovici, Naftali I., et al., "Aperture Coupling Between Adjacent Layers Using a New Stripline Geometry[1]", IEEE Microwave and Guided Wave Letters, v., n1, pp. 24–25 (Jan. 1995).

Lee, Choon Sae, et al., "Gain Enhancement of a Thick Microstrip Antenna by Suppressing Surface Waves," IEEE AP Symp., pp. 460–463 (1994).

Matsui, A., et al., "A Consideration on Parallel Plate Mode Suppression of Triplate–Type Planar Antenna," IEEE AP Symp., pp. 1218–1221 (1994).

Microelectronics, Millman Grabel, ISBn 0–07–100581–1, "Sequential Circuits and Systems," pp. 313–317.

Razavi, Behzad, et al., "Design Techniques for Low–Voltage High–Speed Digital Bipolar Circuits," IEEE Journal of Solid State–Circuits, v29, n3, pp. 332–339 (1994).

*Primary Examiner*—Tuan T. Lam
*Attorney, Agent, or Firm*—Burns, Doane, Swecker & Mathis, L.L.P.

[57] ABSTRACT

A low-voltage latch adapted for differential mode with a supply voltage of 2.5V and a voltage swing of 200 mV to 3000 mV is described. Two inverters, are used, each having a non-inverting and an inverting input terminal and a non-inverted and an inverted output terminal. The non-inverted output terminals are connected to the input of an OR structure, and the inverted output terminals are connected to the input of another OR structure. The input terminals of one inverter form the input terminals of the latch. The input terminals of the other inverter are connected to the output terminals of the OR structures and form the output of the latch. The supply voltages of the inverters are varied, so that at any given time, only one inverter has an appropriate supply voltage. This inverter then controls the output of the latch. In this way, a latch function is achieved.

7 Claims, 2 Drawing Sheets

LATCH CIRCUIT

TECHNICAL FIELD

The present invention relates to latch circuits.

BACKGROUND

Latches are used in electric circuits to hold information temporarily. For example, in a computer system, incoming information may pass through a latch where it is held for a certain time so that it can be read.

The development of sub-micron CMOS technologies results in new standards for voltage supplies. Currently, CMOS circuits use voltage supplies as low as 3.3V, and in the future, voltage supplies as low as 2.5V will probably be used. A traditional ECL gate typically uses voltages of approximately 4.5V–5V. Therefore, there is a need for circuits that can operate at lower voltages. Also the technical development increases the need for faster circuits than those available today.

Latches can be designed to work either in a differential mode or in a single-ended mode.

In single-ended mode, the voltage at one of the inputs is held constant while the other one varies between two modes, one of which is higher, the other lower than the constant voltage at the first input. One drawback with the single-ended mode is that it requires at least twice the voltage swing of the differential mode. Typically the voltage swing in single-ended mode is 600 mV–800 mV.

In differential mode the voltage at both input terminals are varied, and a voltage swing of 200 mV–300 mV is required. This configuration is faster and also less sensitive to noise than the single-ended mode.

In logical circuits, several levels of transistors may be used, so that the output of one transistor controls a transistor at the next level. In ECL logic 3–4 levels of transistors are typically used. By reducing the number of levels, the required supply voltage is reduced. With a supply voltage of 2.5V, only one level of transistors can be used, together with one resistor and one current source.

In Razavi et al. "Design Techniques for Low-Voltage High-Speed Digital Bipolar Circuits", IEEE Journal of Solid-State Circuits, Vol. 29, No. 3, March 1994, a number of low-voltage circuits based on the ECL circuits are disclosed, among them a D-latch. This latch operates in a single ended mode and requires a supply voltage of 2.5V and a voltage swing of approximately 600 mV–800 mV.

SUMMARY

It is an object of the invention to provide a latch with a higher operating speed than known latches.

It is another object of the invention to provide a latch which will operate at voltages down to 2.5V and with a voltage swing as low as 200 mV to 300 mV.

It is yet another object of the invention to provide a latch which operates in differential mode and thus is less sensitive to noise than known low-voltage latches.

The required supply voltage is reduced to 2.5V in the latch according to the invention by using only one level of transistors. The required voltage swing is kept low by letting the latch operate in a differential mode.

The latch according to the invention is based on a simple inverter. A first and a second inverter are used, and a clock signal and the inverse of that clock signal are used to control the supply voltage to the inverters, so that at a given time, one inverter has an appropriate supply voltage and the other effectively has none. The output level of the inverter which has the appropriate supply level corresponds to the input level, while the other inverter has a low output level on both output terminals.

The non-inverted outputs of the inverters are connected to the two input terminals of a OR structure, and the inverted outputs of the inverters are connected to the input terminals of another OR structure. Thus, the inverter across which the voltage is high at any given time, controls the output from the OR structures.

According to the invention, the input terminals of the first inverter are the input terminals of the latch, and the input terminals of the second inverter are the output terminals of the latch. Thus, when the voltage across the first inverter is high, the input signal is fed to the output. When the voltage across the second inverter is high, the output signal is held.

The latch according to the invention offers the following advantages:

It is 10–20% faster than the traditional latch at the same current consumption. Also, it can operate at a lower voltage (down to 2.5V) than the traditional latches, which typically operate on 4.5V–5V. Therefore, the power consumption can be reduced, or the latch can work faster at the same power consumption.

It can be operated in a fully differential mode with a small voltage swing (down to 200 mV–300 mV). This results in 5–10% faster operation compared to the latch of Razavi. The operation also becomes less noise-sensitive because the latch operates in a fully differential mode.

BRIEF DESCRIPTION OF THE DRAWINGS

The invention will be described in more detail below, with reference to the appended drawings, in which.

DETAILED DESCRIPTION

Figure 1:
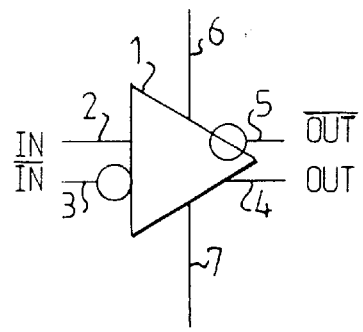
FIG. 1 shows the logical symbol for an inverter.

FIG. 1 shows the logical symbol of an inverter 1. The inverter has a first, non-inverting input terminal 2, a second, inverting input terminal 3, a first, non-inverted output terminal 4 and a second, inverted output terminal 5 The inverter 1 is connected to a first supply voltage terminal 6 and a second supply voltage terminal 7.

In normal operation, the input signal to the second input terminal 3 is the inverse of the input signal to the first input terminal 2. Thus, when the input signal IN to the first input terminal 2 is high, the input signal $\overline{IN}$ to the second input terminal 3 is low. The output signal OUT from the first output terminal 4 is then low, and the output signal $\overline{OUT}$ from the second output terminal 5 is high.

Figure 2:
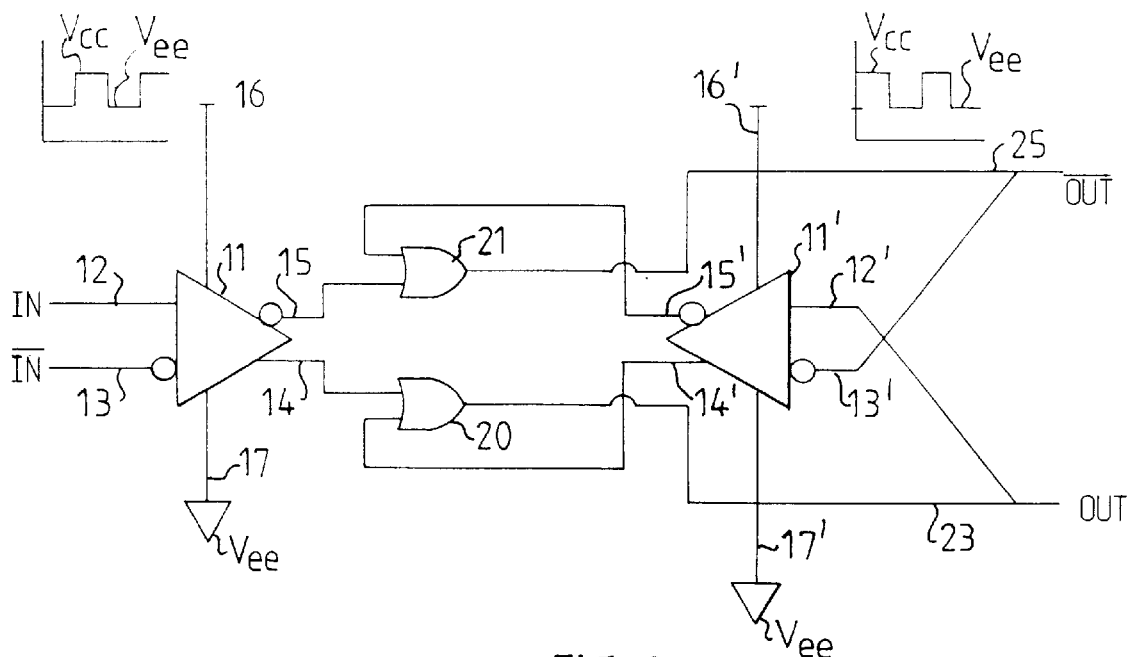
FIG. 2 shows a logical representation of the latch according to the invention.

FIG. 2 shows a logical circuit diagram of the latch according to the invention. A first 11 and a second 11' inverter as shown in FIG. 1 are used. Each inverter has a first, non-inverting input terminal 12, 12', a second, inverting input terminal 13, 13', a first, non-inverted output terminal 14, 14', and a second, inverted output terminal 15, 15'. The input terminals 12, 13 of the first inverter 11 form the input terminals of the latch. Each inverter further has a first supply voltage terminal 16, 16' and a second supply voltage terminal 17, 17'.

The first, non-inverted output terminals 14, 14'of both inverters 11, 11' are connected to the input terminals of a first OR structure 20. The second, inverted output terminals 15, 15' are connected to the input terminals of a second OR structure 21. The output from the OR structures 20, 21 form the output terminals 23, 25 of the latch. These terminals 23, 25 are also connected to the input terminals 12', 13' of the second inverter 11'.

The second supply voltage terminals 17, 17' are held at a constant voltage Vcc. The voltage at the first voltage terminals 16, 16' varies between a supply voltage Vcc and a voltage lower than Vcc so that, at any given time, one inverter has an appropriate supply voltage while the other one does not. As shown in the figure, when the first supply voltage at the first inverter 11 equals Vcc, the first supply voltage at the second inverter 11' is low and vice versa.

When the voltage across the first inverter 11 is high, the voltage across the second inverter 11' is low. In this situation, both the output terminals 14', 15' of the second inverter 11' are low, which means that the output signals of the OR structures 20, 21 are controlled by the output of the first inverter 11. Thus, the output signals from the latch are controlled by the input signals to the latch.

When the voltage across the second inverter 11' is high; the voltage across the first inverter 11 is effectively 0. In this situation, both the output terminals 14, 15 of the first inverter 11 are low, which means that the output signals of the wired OR structures 20, 21 are controlled by the output of the second inverter 11'. As the input terminals 12', 13' of the second inverter are connected to the output terminals 23, 25 of the latch, the output of the latch is effectively held in this situation.

Even though the latch is shown to have two output terminals, one inverted in relation to the other, it is to be noted that the latch could be provided in a circuit in which only one of the outputs is used. Thus, the latch in practice has at least one output.

Figure 3:
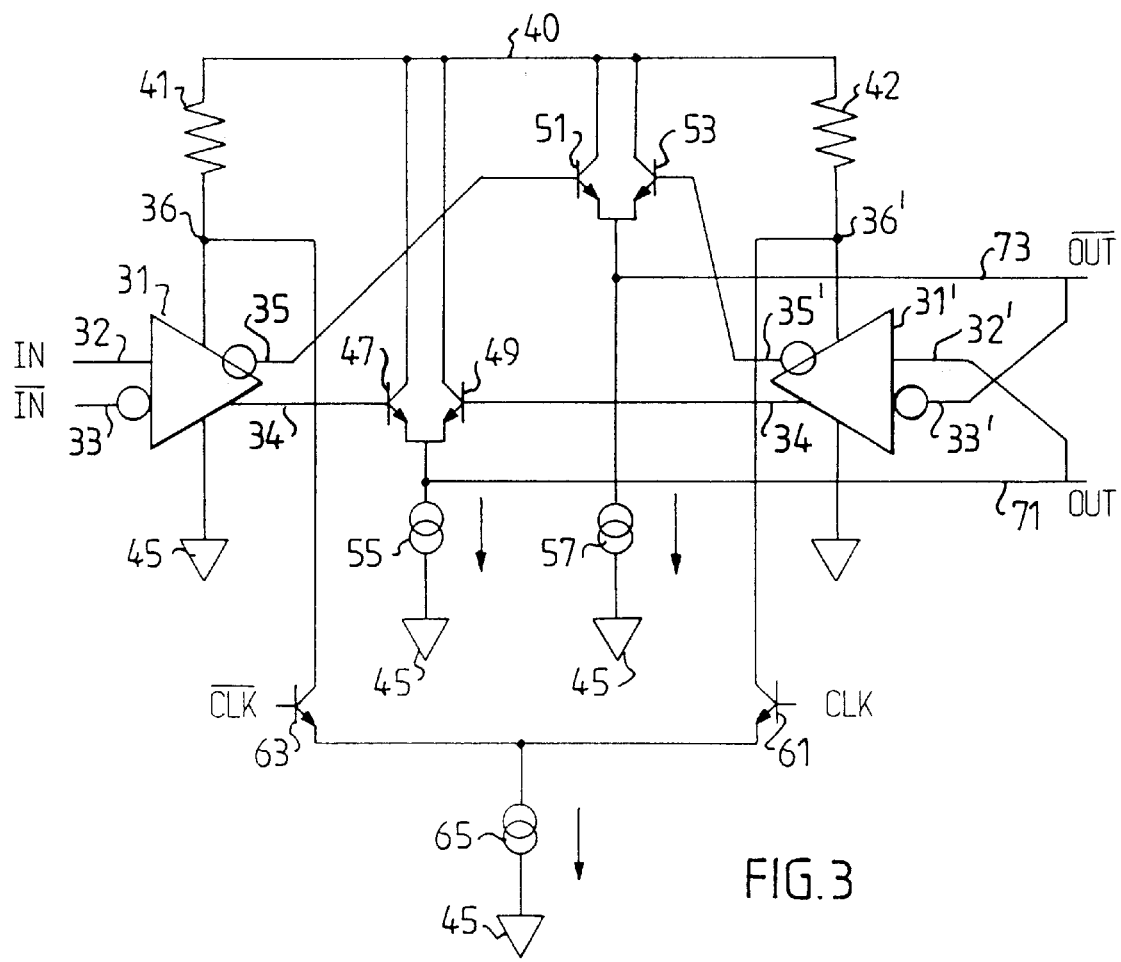
FIG. 3 shows a circuit diagram of the latch according to a preferred embodiment of the invention.

FIG. 3 shows the latch according to an embodiment the invention, based on two inverters 31, 31' as shown in FIG. 1. The first supply voltage terminal 36, 36' of the first 31 and second 31' inverters are connected to a first supply voltage terminal 40 via a resistor 41 and 42 respectively, and directly to the second voltage terminal 45. The first and second input terminals 32, 33 to the first inverter 31 are the input terminals to the whole latch.

The first, non-inverted output terminals 34, 34' of the inverters 31', 31" are connected to the base of a first and a second transistor 47, 49 respectively. The second, inverted output terminals 35, 35' are connected to the bases of a third and a fourth transistor 51, 53 respectively.

The collectors of all four transistors, 47, 49, 51, 53 are connected to the first supply voltage terminal 40. The emitters of the first and second transistor 47 and 49 are interconnected and, via a current source 55, connected to the second supply voltage terminal 45. They are also connected to the first output terminal 71 of the whole circuit, which is connected to the first input terminal 32' of the second inverter 31'. The emitters of transistors 51 and 53 are interconnected and, via a current source 57, connected to the second supply voltage terminal 45. They are also connected to the second output terminal 73 of the whole circuit, which is connected to the second input terminal 33' of the second inverter 31'.

Because the emitters of transistors 47 and 49 are interconnected, they form a wired OR structure, which means that the transistor that has the highest base voltage of the two controls the output of the wired OR structure. In the same way transistors 51 and 53 form another wired OR structure.

There is a fifth transistor 61, intended for receiving a first clock signal CLK, whose collector is connected between the second inverter 31' and the resistor 42. There is also a sixth transistor 63, intended for receiving an inverted clock signal $\overline{CLK}$, whose collector is connected between the first inverter 31 and the resistor 41. The emitters of the transistors 61, 63 are interconnected, and, through a current source 55, connected to the second supply voltage terminal 45.

The second clock signal $\overline{CLK}$ controls the supply voltage to the first inverter 31, and the first clock signal CLK controls the supply voltage to the second inverter 31'. Because the emitters of the two transistors 61, 63 are interconnected, they will act like a current switch, which means that the transistor which has the highest base voltage will be conducting while the other one will be blocked, even at voltage differences as low as 200 mV.

First assume that the first clock signal CLK is high, and the second clock signal $\overline{CLK}$ is low. The first inverter 31 then has a supply voltage approximately equal to the first supply voltage terminal 40 (called "high"), while the supply voltage to the second inverter 31' is decreased ("low"). Thus the base voltages of the transistors 49 and 53 are low and the input signals of the first inverter 31 are transmitted, through the wired OR structures to the output. If the output 34 from the first inverter 31 is high and the inverted output 35 is low, the base voltage of transistor 47 is high and the base voltage of transistor 51 is low. Thus, the first output terminal 71 of the latch will be high, and the second output terminal 73 will be low. If the output 34 from the first inverter 31 is low and the inverted output 35 is high, the base voltage of transistor 47 is low and the base voltage of transistor 51 is high. Thus, the first output terminal 71 of the latch will be low and the second output terminal 73 will be high.

When the first control signal CLK is low, the second (inverted) control signal $\overline{CLK}$ is high. The second inverter 31' then has a high supply voltage, while the supply voltage to the first inverter 31 is effectively zero. Thus, the output signals OUT, $\overline{OUT}$ are transmitted, through the second inverter 31' and the wired OR structures to the output; i.e. effectively, the output is held.

Figure 4:
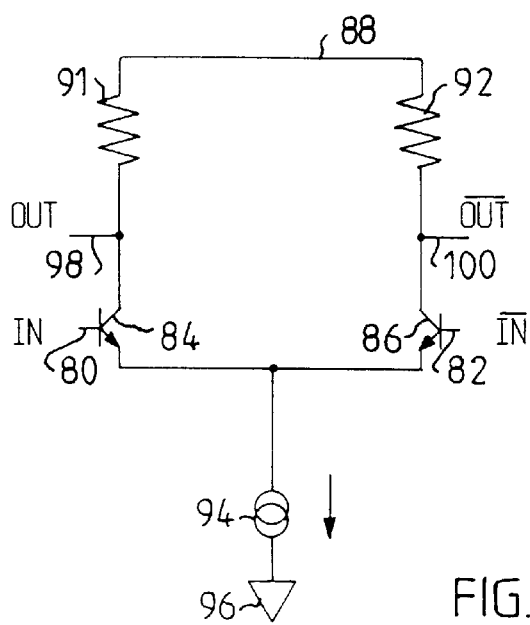
FIG. 4 shows a circuit diagram of a CML inverter used in a preferred embodiment of the invention.

FIG. 4 shows a circuit diagram of a standard CML (Current Mode Logic) inverter used in a preferred embodiment of the invention. The inverter has a first input terminal 80 and a second input terminal 82. The first input terminal 80 is connected to the base of a first transistor 84, and the second input terminal 82 is connected to the base of a second transistor 86. The collector of each transistor 84, 86 is connected to a first supply voltage terminal 88 via a resistor 90 and 92 respectively. The emitters of the two transistors 84, 86 are inter-connected and, via a current source 94, connected to a second supply voltage terminal 96. A first output terminal 98 is located at the collector of the transistor 84, and a second output terminal 100, is located at the collector of the transistor 86.

When the input is high, and the inverted input low, the transistor 84 conducts current, which means that the voltage of the first output terminal 98 is decreased. The transistor 86 does not conduct in this situation, and hence the voltage of the second output terminal 100 is approximately that of the first supply voltage terminal 88. When the input at the first input terminal 80 is low and the input at the second input terminal 82 is high, for symmetry reasons, the voltage of the first output terminal 98 is approximately that of the first voltage terminal 88 while the voltage of the second output terminal 100 is decreased. The voltage swing is approximately 200 mV–300 mV.

What is claimed is:

1. A latch circuit comprising first and second inverting means, each inverting means comprising a first and a second input terminal, one being non-inverting and the other inverting; a first and a second output terminal, one being inverted said the other non-inverted; and a first and a second voltage terminal;

> wherein one of the output terminals of each inverting means is connected to a first and second input terminal, respectively, of a first logical gate structure;
>
> the other output terminal of each inverting means is connected to a first and second input terminal, respectively, of a second logical gate structure;
>
> an output terminal of the first logical gate structure is connected to one of the input terminals of the second inverting means;
>
> an output terminal of the second logical gate structure is connected to the other input terminal of the second inverting means;
>
> the voltage terminals of the inverting means receive voltage patterns that vary with time in such a way that the voltage pattern of one inverting means is the inverse of the voltage pattern of the other inverting means; and
>
> at least the output of one of the logical gate structures is an output of the latch circuit.

2. The latch of claim 1, wherein each logical gate structure is an OR structure formed by two transistors wired so that the bases of the transistors are the input terminals of the OR structure, the collectors are connected to a first supply voltage, and the emitters are interconnected and connected to a second supply voltage and form the output terminals of the latch.

3. The latch of claim 1, wherein the inverting means are CML inverters.

4. The latch of claim 2, wherein the first voltage terminals of the inverting means are connected via resistors to the first supply voltage, and the second voltage terminals are connected to the second supply voltage.

5. The latch of claim 4, wherein the first supply voltage to the inverting means is controlled by transistors whose collectors are connected to the first voltage terminal of each inverter, whose emitters are interconnected and, via a current source, connected to the second supply voltage, which transistors are intended for receiving a clock signal CLK and an inverse clock signal, $\overline{CLK}$, respectively, on their bases.

6. A method for controlling an output of an electronic circuit having a first and a second inverter, comprising the steps of:

> feeding an input as a non-inverted signal and an inverted signal to the first inverter;
>
> varying a supply voltage of the two inverters such that only one of the two inverters is working at any given time;
>
> feeding an output signal from first output terminals of the two inverters as an input signal to a first logical gate structure;
>
> feeding an output signal from second output terminals of the two inverters as an input signal to a second logical gate structure;
>
> feeding all output signal from the first and second logical gate structures as all input signal to the second inverter; and
>
> taking the output from at least one of the logical gate structures.

7. The method of claim 6, wherein the supply voltage is varied by applying a clock signal CLK to the base of a first transistor whose collector is connected to a first supply voltage terminal of the first inverter and an inverse clock signal $\overline{CLK}$ to the base of a second transistor whose collector is connected to a first supply voltage terminal of the second inverter, and the emitters of the first and second transistors are interconnected and, via a current source, are connected to a second supply voltage terminal.

* * * * *